United States Patent
Izumi

(10) Patent No.: US 8,939,698 B2
(45) Date of Patent: Jan. 27, 2015

(54) CEILING TRAVELING VEHICLE AND METHOD FOR PREVENTING PROTRUSION FROM CEILING TRAVELING VEHICLE

(75) Inventor: Takanori Izumi, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 288 days.

(21) Appl. No.: 13/695,786

(22) PCT Filed: May 25, 2010

(86) PCT No.: PCT/JP2010/058808
§ 371 (c)(1),
(2), (4) Date: Nov. 1, 2012

(87) PCT Pub. No.: WO2011/148459
PCT Pub. Date: Dec. 1, 2011

(65) Prior Publication Data
US 2013/0051962 A1     Feb. 28, 2013

(51) Int. Cl.
*B25J 9/10* (2006.01)
*H01L 21/677* (2006.01)
*B66C 13/06* (2006.01)

(52) U.S. Cl.
CPC .......... *H01L 21/67733* (2013.01); *B66C 13/06* (2013.01); *H01L 21/67766* (2013.01)
USPC ....................................................... 414/591

(58) Field of Classification Search
CPC ........ B66C 11/04; B66C 13/06; B66C 15/00; B66C 5/04
USPC ....................................................... 414/591
See application file for complete search history.

(56) References Cited

U.S. PATENT DOCUMENTS

| 7,516,859 | B2 | 4/2009 | Taniguchi |
| 7,845,284 | B2* | 12/2010 | Izumi et al. ................ 104/88.02 |
| 2008/0014071 | A1* | 1/2008 | McCaffrey .................... 414/787 |
| 2008/0128376 | A1 | 6/2008 | Taniguchi |

FOREIGN PATENT DOCUMENTS

| JP | 61-145098 | 7/1986 |
| JP | 5-330789 | 12/1993 |
| JP | 2008-127200 A | 6/2008 |

OTHER PUBLICATIONS

International Search Report based off PCT/JP2010/058808 filed May 25, 2010.

* cited by examiner

*Primary Examiner* — Gerald McClain
(74) *Attorney, Agent, or Firm* — Adli Law Group P.C.

(57) ABSTRACT

A moving unit, an elevation device, or the like is prevented from laterally projecting from an overhead travelling vehicle and interfering with a stationary device or an overhead travelling vehicle in the neighborhood thereof. Projection from an overhead travelling vehicle is prevented, the vehicle including a travelling unit, an elevation device lifting and lowering articles, and a lateral movement mechanism including a base member supported by the travelling unit and a moving unit laterally moving while supporting the elevation device. The moving unit is moved between a state in which it laterally protrudes from the travelling unit and a state in which it is retracted to a position under the travelling unit. The moving unit or the elevation device is engaged with the base member or the travelling unit in the state in which the moving unit is retracted to the position under the travelling unit.

4 Claims, 5 Drawing Sheets

CEILING TRAVELING VEHICLE AND METHOD FOR PREVENTING PROTRUSION FROM CEILING TRAVELING VEHICLE

CROSS-REFERENCE

The present application is a National phase of PCT/P2010/058808, filed on May 25, 2010, and published as WO2011/148459.

TECHNICAL FIELD

The present invention relates to preventing a transfer device from unintentionally projecting from an overhead travelling vehicle.

BACKGROUND OF THE INVENTION

JP2008-127200A proposes a lateral movement mechanism on an overhead travelling vehicle to laterally move an elevation device that lifts and lowers articles. The lateral movement mechanism is configured of, for example, a belt-driven slide fork, and if the belt is cut, a moving unit of the slide fork may unintentionally project and interfere with an overhead travelling vehicle opposite thereto or, for example, a strut of a buffer in the neighborhood thereof.

There is a need in the art to prevent a moving unit from unintentionally projecting even when trouble has occurred with a lateral movement mechanism.

SUMMARY OF THE INVENTION

The present invention is directed to an overhead travelling vehicle including a travelling unit, an elevation device lifting and lowering articles, and a lateral movement mechanism, the lateral movement mechanism including a base member supported by the travelling unit and a moving unit supporting the elevation device, the base member moving the moving unit between a state in which the moving unit laterally protrudes from the travelling unit and a state in which the moving unit is retracted to a position under the travelling unit, the overhead travelling vehicle including:

an engagement device engaging the moving unit or the elevation device with the base member or the travelling unit in the state in which the moving unit is retracted to the position under the travelling unit.

The present invention is also directed to a method for preventing projection from an overhead travelling vehicle including a travelling unit, an elevation device lifting and lowering articles, and a lateral movement mechanism including a base member supported by the travelling unit and a moving unit laterally moving while supporting the elevation device, the method including:

a step for moving the moving unit between a state in which the moving unit laterally protrudes from the travelling unit and a state in which the moving unit is retracted to a position under the travelling unit; and a step for engaging the moving unit or the elevation device with the base member or the travelling unit in the state in which the moving unit is retracted to the position under the travelling unit.

The moving unit or the elevation device is engaged with the base member or the travelling unit, and therefore the moving unit or the elevation device will not unintentionally project. Although an example in which the moving unit is engaged with the base member will be described in an embodiment, the moving unit may be engaged with the travelling unit, or the elevation device may be engaged with the base member.

Preferably, the moving unit or the elevation device has a member provided with a hole for engagement, and the engagement device includes at least one pin that is advanced and retracted between a state in which the pin is engaged in the hole and a state in which the pin is disengaged from the hole, and a mechanism for advancing and retracting the at least one pin. With this configuration, the engagement and disengagement can be performed in a simple manner by advancing and retracting the pin. The member provided with a hole for engagement may be, for example, the moving unit itself or may be a separate member provided on the moving unit.

Preferably, the moving unit includes a top unit supporting the elevation device and a middle unit disposed between the base unit and the top unit, each of the top unit and the middle unit has the member provided with a hole for engagement, and the engagement device engages and disengages the at least one pin in and from the respective holes for engagement of the top unit and the middle unit. With this configuration, the top unit and the middle unit can be each individually engaged and anchored. In particular, in cases where separate members are used as a member, such as a belt, that drives the middle unit and a member, such as a belt, that drives the top unit, a situation in which even though only the middle unit or the top unit is engaged, the other member projects is conceivable. In contrast, when both of the top unit and the middle unit are engaged, neither of the members unintentionally projects.

More preferably, the engagement device advances and retracts the at least one pin such that the pin is engaged in the respective holes for engagement of the top unit and the middle unit with a single stroke and disengaged therefrom with a single stroke. When engagement is established with a single stroke and the engagement is released with a single stroke, control is unnecessary between the engagement and the disengagement, so that the reliability of control is increased. Moreover, when engagement and disengagement are performed with a single stroke, the engagement and the disengagement can be performed quickly.

Particularly preferably, the at least one pin is two pins located at different positions in a plan view, and the holes for engagement of the top unit and the middle unit are located at different positions in a plan view. With this configuration, as compared with cases where two holes are overlapped with each other in a plan view and a single pin is moved up and down with a long stroke, the pins can be reliably moved up and down with a short stroke.

BRIEF DESCRIPTION OF DRAWINGS

FIG. 7 is a side view showing an engagement device and relevant portions of a lateral movement mechanism according to a second variation.

DETAILED DESCRIPTION OF THE INVENTION

Figure 1:
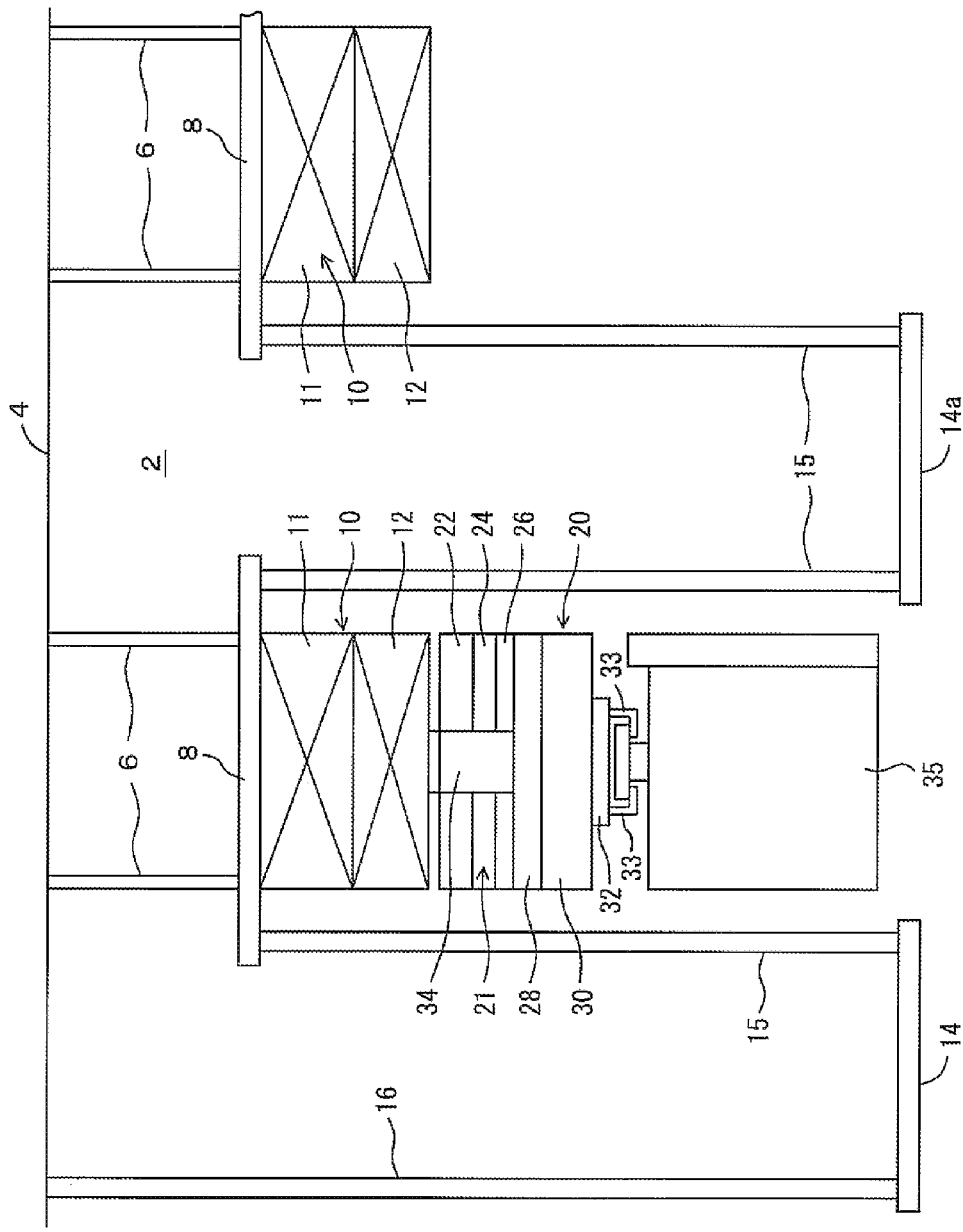
FIG. 1 is a front view showing an overhead travelling vehicle according to an embodiment and travelling rails and buffers in the neighborhood thereof.

FIGS. 1 to 9 show an embodiment and variations thereof. In the figures, reference numeral 2 denotes an overhead space such as an overhead space in a clean room, and below FIG. 1 are a semiconductor processing device and the like (not shown). Reference numeral 4 denotes a ceiling, such as a ceiling of a clean room, which supports rails 10 for an overhead travelling vehicle 20 via struts 6 and support members 8. The rails 10 each include, for example, a travelling rail 11 and an electricity feeding rail 12, and struts 15 and 16 supports a buffer 14 for articles such as a FOUP 35 to be temporarily placed thereon. The buffer 14 may be replaced with an appropriate automated storage and retrieval system, stocker, or the like, and a buffer 14a between the right and left travelling rails 10, 10 in FIG. 1 may not be provided. Furthermore, although the lateral pair of travelling rails 10, 10 is provided in FIG. 1, it is also possible that only one of these is provided.

The overhead travelling vehicle 20 includes a travel driving unit and an electricity receiving unit, which are not shown; the travel driving unit is disposed in the travelling rail 11, and the electricity receiving unit is disposed in the electricity feeding rail 12 and receives electricity from a non-contact electricity feeder line or the like provided in the rail 12. The travel driving unit and the electricity receiving unit are collectively referred to as a travelling unit. A shaft extending from the travelling unit supports a slide fork 21, and the travelling unit supports a base unit 22 thereof. Below the base unit 22 are a middle unit 24 and a top unit 26, which are advanced and retracted on both sides in a lateral direction in FIG. 1 to laterally move a rotary device 28, the FOUP 35, and components disposed therebetween. The slide fork 21 corresponds to a lateral movement mechanism, and the middle unit 24 and the top unit 26 correspond to a moving unit. The slide fork 21 may be of a type that protrudes to only one of the right and left sides, instead of a type that protrudes to both the right and left sides.

The rotary device 28, which rotates an elevation device 30 around a vertical axis, may not be provided, and, in the claims, the rotary device 28 is regarded as a part of an elevation device. The elevation device 30 lifts and lowers an elevation platform 32 through a suspending material such as a belt, a rope, or a wire, and the elevation platform 32 grips or releases articles such as the FOUP 35 through, for example, a pair of claws 33. An engagement device 34 is attached to the base unit 22 or the travelling unit and engaged with the middle unit 24 and the top unit 26 so as to prevent these units from unintentionally projecting in the lateral direction. The configuration of the engagement device 34 will be described later with reference to FIGS. 3 to 9.

Figure 2:
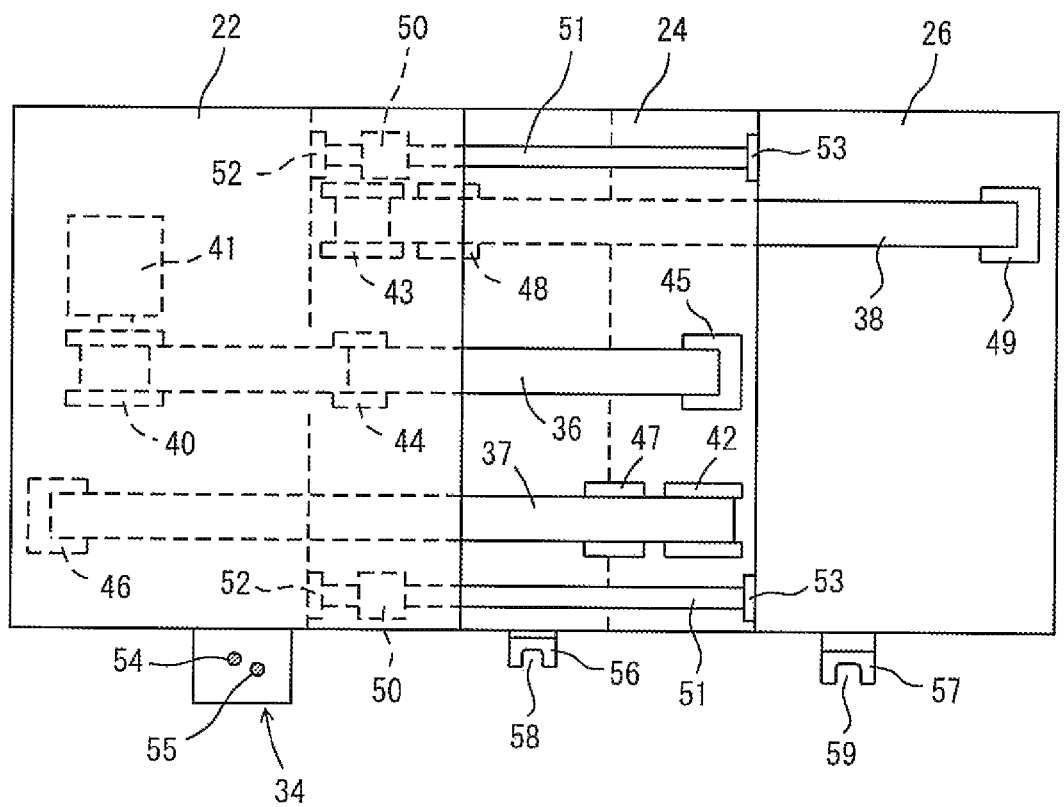
FIG. 2 is a plan view of relevant portions of a lateral movement mechanism of the overhead travelling vehicle according to the embodiment.

FIG. 2 shows an example of the configuration of the slide fork 21; however, there is no limitation to this. Reference numerals 36 to 38 denote belts, and of these belts, the belt 36 is a driving belt and the belts 37 and 3S are follower belts. Reference numeral 40 denotes a driving pulley, which drives the belt 36 through a driving motor 41, and idler pulleys 42 and 43 are provided for the belts 37 and 38. Reference numerals 44 to 49 denote fixed ends of the belts 36 to 38. The driving pulley 40 and the fixed ends 44, 46, and 48 are provided on the base unit 22, and the idler pulleys 42 and 43 and the fixed end 45 are provided on the middle unit 24. The fixed ends 47 and 49 are provided on the top unit 26.

Guide members 50 and rails 51 are provided between the base unit 22 and the middle unit 24, and stoppers 52 and 53 are provided, for example, on opposite ends of each rail 51. Here, the rails 51 are provided on the middle unit 24 and the guide members 50 are provided on the base unit 22; however, the rails and the guide members ma be arranged conversely. Similarly, guide members, rails, and stoppers are also provided between the middle unit 24 and the top unit 26. As described above, when the belt 36 is driven by the driving pulley 40, the belts 37 and 38 follow, so that the middle unit 24 laterally moves to the right and left sides of the base unit 22, and the top unit 26 moves to both the right and left sides with a stroke that is, for example, twice the stroke of the middle unit 24.

Figure 3:
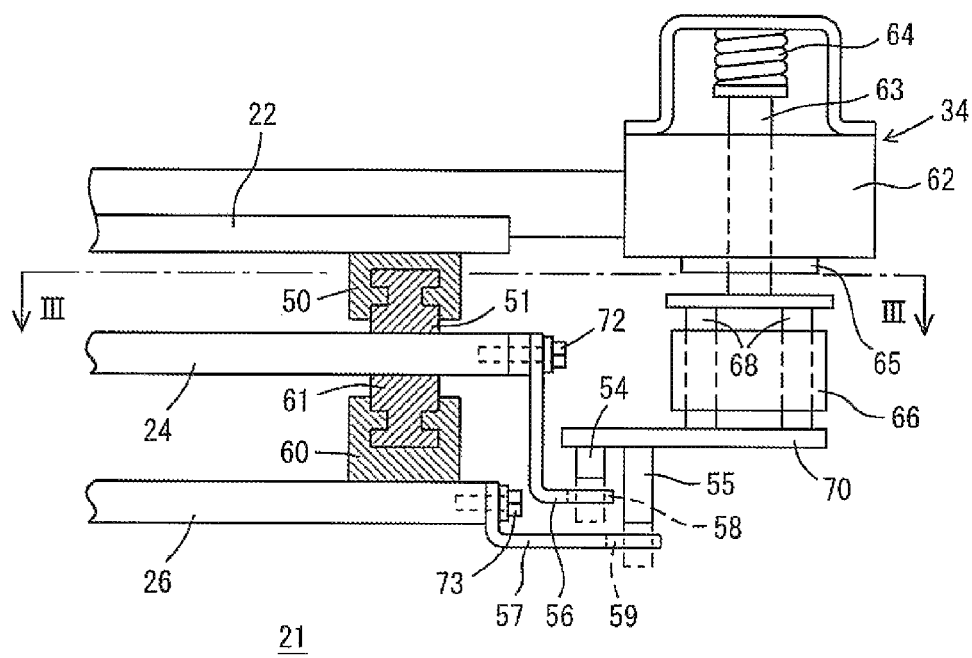
FIG. 3 is a side view showing the relevant portions of the lateral movement mechanism and an engagement device of the overhead travelling vehicle according to the embodiment.
Figure 4:
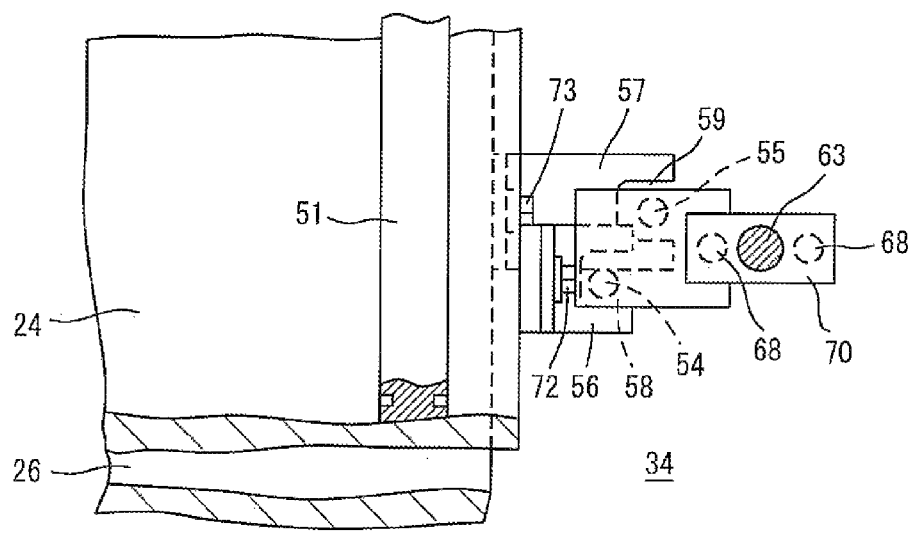
FIG. 4 is a horizontal cross-sectional view taken along line III-III in FIG. 3.

FIGS. 3 and 4 show the configuration of the engagement device 34 according to the embodiment. The middle unit 24 is provided with an engagement member 56 having an L-shape as viewed from the side, and the top unit 26 is also provided with an engagement member 57 having an L-shape as viewed from the side as well. The L-shaped engagement members 56 and 57 have a horizontal end, and the two end portions are arranged, for example, at mutually different height positions so as to be overlapped with each other in a plan view. A hole 58 is provided in the end of the engagement member 56, and a hole 59 is provided in the end of the engagement member 57. The engagement device 34 vertically moves as pair of pins 54 and 55, thereby advancing and retracting these pins into and from the holes 58 and 59, respectively, and the pins 54 and 55 are attached to a plate 70. Moreover, for example, a pair of shafts 68 is attached to the plate 70 to connect this plate to a magnetic plate 65 via a guide 66. A shall 63 of a solenoid 62 is connected to the magnetic plate 65, and the shaft 63 is pressed downward by a spring 64.

As a result, when an electric current is passed through the solenoid 62, a coil is excited, so that the magnetic plate 65 is attracted as shown in FIG. 3, and the pins 54 and 55 are moved up out of engagement with the holes 58 and 59. When the electric current to the solenoid 62 is turned off, the shaft 63 moves down due to the spring 64, and the pins 54 and 55 are brought into engagement with the holes 58 and 59. Thus, unless an electric current is passed through the solenoid 62, lateral movement of the base unit 22 and the top unit 26 is inhibited. In addition, control of the solenoid 62 is simple, and both the engagement operation and the disengagement operation thereof are performed with a single stroke. Since the separate pins 54 and 55 are provided for the holes 58 and 59, respectively, the upward and downward stroke of the pins 54 and 55 can be reduced. Accordingly, engagement and disengagement cart be performed reliably in as short period of time by simple control.

The above embodiment has advantages such as the following. Even in the case where the belts 36 to 38 are cut for some reason, the middle unit 24 or the top unit 26 does not laterally project unless an electric current is passed through the solenoid 62. Thus, the top unit 26, the elevation device 30, the components disposed therebetween, and the like do not interfere with another overhead travelling vehicle travelling along the rail 10 opposite thereto. Also, there is no interference with the buffer 14 and the like provided to the right and left thereof. The engagement of the middle unit 24 and the top unit 26 is established using, for example, the pair of pins 54 and 55, and since these pins can be driven by the same solenoid 62, control is simple, and, moreover, since the separate pins 54 and 55 are provided for the respective holes 58 and 59, the stroke can be reduced. Although the middle unit 24 and the top unit 26 are engaged in the above embodiment, the rotary device 28 or the elevation device 30 may be engaged with the base unit 22 instead. Furthermore, if, in addition to the base unit 22, there is any member connected to the travelling unit side, the engagement device 34 may be attached to that member.

Figure 5:
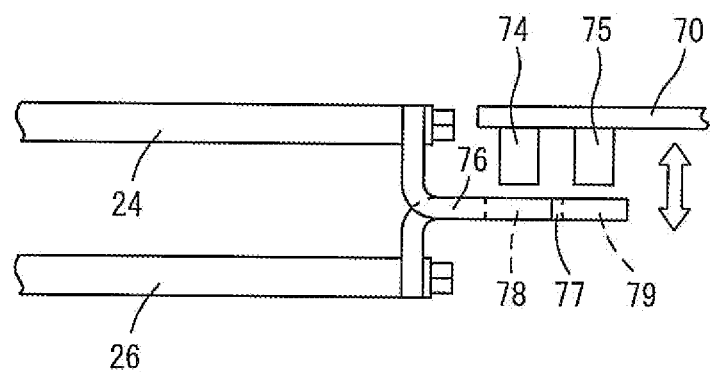
FIG. 5 is a side view showing an engagement device and relevant portions of a lateral movement mechanism according to a variation.
Figure 6:
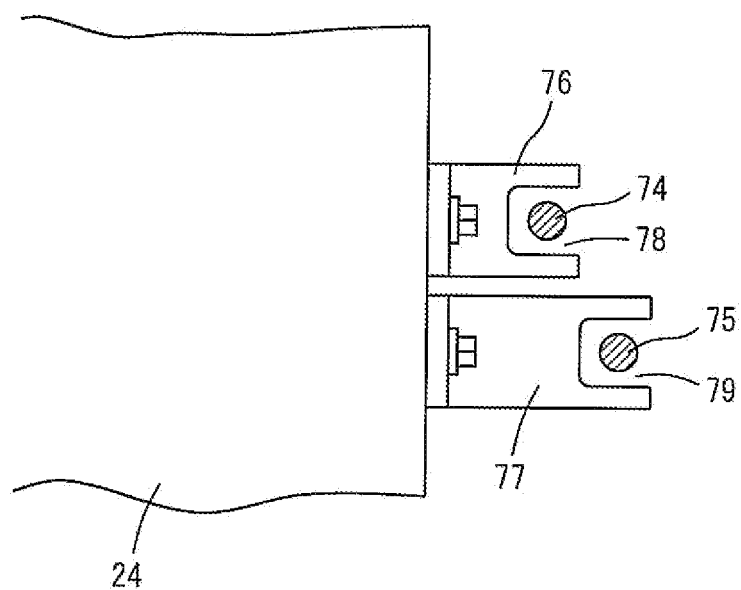
FIG. 6 is a plan view showing the engagement device and relevant portions of the lateral movement mechanism according to the variation.

FIGS. 5 and 6 show an engagement device according to a variation, and the other aspects of this variation are similar to the embodiment shown in FIGS. 1 to 4. In FIGS. 5 and 6, end portions of engagement members 76 and 77 are made to be at the same height to make holes 78 and 79 be at the same height. As a result, ends of pins 74 and 75 are located at the same height position. In this case, the stroke necessary for the pins is the stroke for advancement into and retraction from the holes 78 and 79, and remains unchanged from that of the embodiment shown in FIGS. 1 to 4.

Figure 8:
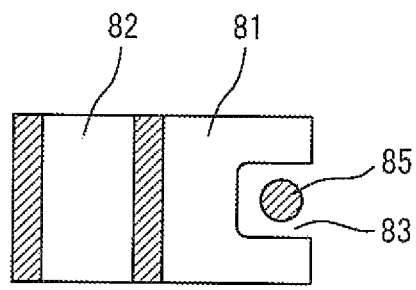
FIG. 8 is a plan view showing a pin of the engagement device and relevant portions of the lateral movement mechanism according to the second variation.

FIGS. 7 and 8 show a second variation. Reference numeral 81 and 82 denote new engagement members; the engagement member 81 is attached to, for example, a middle unit, and the engagement member 82 is attached to, for example, a top unit. Holes 83 and 84 that are overlapped with each other a plan view are provided in an end of the respective engagement members 81 and 82, and a single pin 85 is advanced into and retracted from these holes. With this configuration, when compared with the above embodiment, the stroke is increased by a distance S in FIG. 7, and a stronger solenoid and a stronger spring are necessary.

Figure 9:
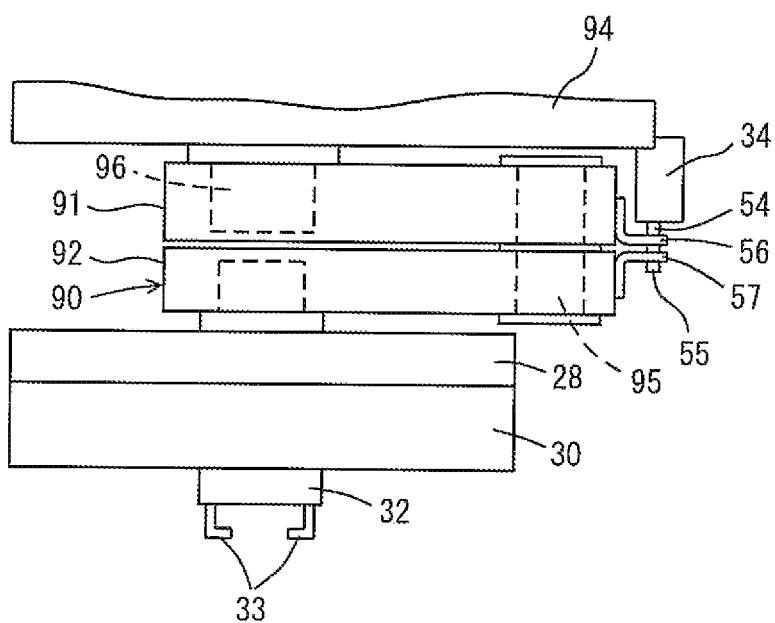
FIG. 9 is a side view showing an engagement device and relevant portions of a lateral movement mechanism according to a third variation.

Although the slide fork 21 is used as the lateral movement mechanism in the above-described embodiment and variations, a SCARA (Selective Compliance Assembly Robot Arm) arm or the like may also be used. FIG. 9 shows an example in which a SCARA arm is used as the lateral movement mechanism, and aspects other than those particularly pointed out are similar to the above embodiment. Reference numeral 90 denotes a SCARA arm, which is configured of an upper arm 91 and a lower arm 92, and, for example, engagement members 56 and 57 are provided in the neighborhood of a shaft that connects the upper arm 91 and the lower arm 92 to each other, and a pair of pins 54 and 55 is advanced and retracted by an engagement device 34 as in the embodiment shown in FIGS. 1 to 4. The engagement device 34, the engagement members 56 and 57, and the like may be provided on the side of a shall 96 that connects a main body portion 94 and the upper arm 91 to each other.

DESCRIPTION OF REFERENCE NUMERALS 2 overhead space
4 ceiling
6 strut
8 support member
10 rail
11 travelling rail
12 electricity feeding rail
14 buffer
15, 16 strut
20 overhead travelling vehicle
21 slide fork
22 base unit
24 middle unit
26 top unit
28 rotary device
30 elevation device
32 elevation platform
33 claw
34 engagement device
35 FOUP
36 to 38 belt
40 driving pulley
41 driving motor
42, 43 idler pulley
44 to 49 fixed end
50, 60 guide member
51, 61 rail
52, 53 stopper
54, 55 pin
56, 57 engagement member
58, 59 hole
62 solenoid
63, 68 shaft
64 spring
65 magnetic plate
66 guide
70 plate
72, 73 bolt
74, 75 pin
76, 77 engagement member
78, 79 hole
81, 82 engagement member
83, 84 hole
85 pin
90 SCARA arm
91 upper arm
92 lower arm
94 main body portion
95, 96 shaft

The invention claimed is:

1. An overhead travelling vehicle comprising:
a travelling unit, an elevation device lifting and lowering articles, and a lateral movement mechanism, the lateral movement mechanism including a base member supported by the travelling unit and a moving unit supporting the elevation device, the base member moving the moving unit between a state in which the moving unit laterally protrudes from the travelling unit and a state in which the moving unit is retracted to a position under the travelling unit, and
an engagement device engaging the moving unit or the elevation device with the base member or the travelling unit in the state in which the moving unit is retracted to the position under the travelling unit,
wherein the moving unit or the elevation device has a member provided with a hole for engagement, and
the engagement device includes at least one pin that is advanced and retracted between a state in which the pin is engaged in the hole and a state in which the pin is disengaged from the hole, and a mechanism for advancing and retracting the at least one pin,
wherein the moving unit includes a top unit supporting the elevation device and a middle unit disposed between the base unit and the top unit,
each of the top unit and the middle unit has the member provided with a hole for engagement, and
the engagement device engages and disengages the at least one pin in and from the respective holes for engagement of the top unit and the middle unit.

2. The overhead travelling vehicle according to claim 1, wherein the engagement device advances and retracts the at least one pin such that the pin is engaged in the respective holes for engagement of the top unit and the middle unit with a single stroke and disengaged therefrom with a single stroke.

3. The overhead travelling vehicle according to claim 2, wherein the at least one pin is two pins located at different positions in a plan view, and the holes for engagement of the top unit and the middle unit are located at different positions in a plan view.

4. A method for preventing projection from an overhead travelling vehicle including a travelling unit, an elevation device lifting and lowering articles, and a lateral movement mechanism including a base member supported by the travelling unit and a moving unit laterally moving while supporting the elevation device, the method comprising:

a step for moving the moving unit between a state in which the moving unit laterally protrudes from the travelling unit and a state in which the moving unit is retracted to a position under the travelling unit; and a step for engaging the moving unit or the elevation device with the base member or the travelling unit in the state in which the moving unit is retracted to the position under the travelling unit, wherein the moving unit or the elevation device has a member provided with a hole for engagement, and the engagement device includes at least one pin that is advanced and retracted between a state in which the pin is engaged in the hole and a state in which the pin is disengaged from the hole, and a mechanism for advancing and retracting the at least one pin, wherein the moving unit includes a top unit supporting the elevation device and a middle unit disposed between the base unit and the top unit, each of the top unit and the middle unit has the member provided with a hole for engagement, and the engagement device engages and disengages the at least one pin in and from the respective holes for engagement of the top unit and the middle unit.

* * * * *